| (12) United States Patent<br>Kyouda et al. | (10) Patent No.: US 7,742,146 B2<br>(45) Date of Patent: Jun. 22, 2010 |
|---|---|

(54) COATING AND DEVELOPING METHOD, COATING AND DEVELOPING SYSTEM AND STORAGE MEDIUM

(75) Inventors: Hideharu Kyouda, Koshi (JP); Kousuke Yoshihara, Koshi (JP); Taro Yamamoto, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 683 days.

(21) Appl. No.: 11/623,481

(22) Filed: Jan. 16, 2007

(65) Prior Publication Data

US 2007/0184392 A1 Aug. 9, 2007

(30) Foreign Application Priority Data

Feb. 3, 2006 (JP) .............................. 2006-026518

(51) Int. Cl.
*G03B 27/52* (2006.01)
*G03D 5/00* (2006.01)
*H01L 21/00* (2006.01)

(52) U.S. Cl. ........................... 355/27; 355/30; 396/611; 430/311

(58) Field of Classification Search .................... 355/27, 355/30, 53; 396/622, 611; 134/95.3, 144, 134/157, 902; 118/52; 430/311, 434
See application file for complete search history.

(56) References Cited

U.S. PATENT DOCUMENTS 7,267,497 B2 * 9/2007 Akimoto et al. ............. 396/611

FOREIGN PATENT DOCUMENTS

| JP | 2005-175079 | 6/2005 |
| JP | 2005-183709 | 7/2005 |

OTHER PUBLICATIONS

English Translation of JP 2005-175079 (dated Jun. 30, 2005).*
English Translation of JP 2005-183709 (dated Jul. 7, 2005).*

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

A resist film formed on a substrate is coated with a water-repellent protective film and the substrate is subjected to a developing process after the substrate has been processed by an immersion exposure process. The protective film is removed from the substrate after the resist film has been processed by the immersion exposure process, the substrate is processed by a heating process, and then the substrate is subjected to a developing process. The surface of the substrate is cleaned with a cleaning liquid before the protective film is removed and after the substrate has been processed by the immersion exposure process or the surface of the substrate is cleaned with a cleaning liquid after removing the protective film and before the substrate is subjected to the heating process.

17 Claims, 9 Drawing Sheets

COATING AND DEVELOPING METHOD, COATING AND DEVELOPING SYSTEM AND STORAGE MEDIUM

BACKGROUND OF THE INVENTION

1. Field of the Invention

The present invention relates to a coating and developing method of and a coating and a developing system for coating a surface of a substrate with a liquid resist film and processing the substrate coated with the resist film processed by an immersion exposure process, and a storage medium storing programs for accomplishing the coating and developing method.

2. Description of the Related Art

Photolithography applied to fabricating a semiconductor device includes a series of processes for forming a resist film on, for example, a semiconductor wafer (hereinafter, referred to simply as "wafer"), exposing the resist film through a photomask, and developing the exposed resist film to form a desired resist pattern on the wafer.

Figure 10:
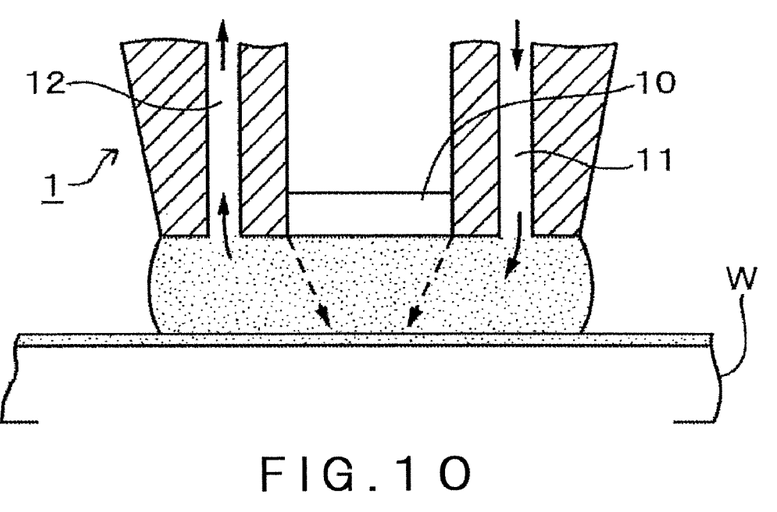
FIG. 10 is a view of assistance in explaining an exposure system for processing a wafer by an immersion exposure process.
Figure 11:
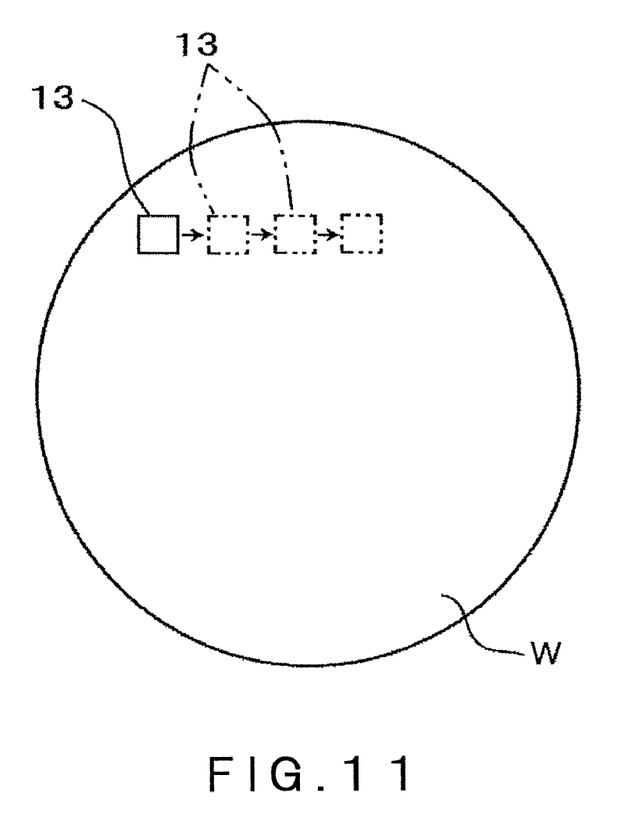
FIG. 11 is a view of assistance in explaining successively processing shot areas on a wafer by the exposure system.

An exposure method coats a surface of a substrate with a liquid film and exposes the surface through the liquid film. This exposure method will be referred to as "immersion exposure method". Such an exposure method is disclosed in JP-A 2005-175079 (Patent document 1). As shown in FIG. 10, an exposure device 1 is provided with a lens 10 on a central part of its lower end, a pouring opening 11 and a suction hole 12. Pure water is poured onto the surface of a wafer W and the pure water poured onto the wafer W is recovered through the suction hole 12 to form a liquid film (pure water film) in the gap between the lens 10 and the surface of the wafer W. A resist film formed on the surface of the wafer W is exposed to light through the liquid film. Then, as shown in FIG. 11, the exposure device 1 is moved horizontally to position the exposure device 1 at the next shot area 13 and an exposure cycle for exposing the shot area 13 to light is repeated to transfer the predetermined circuit pattern successively to shot areas 13 in the surface of the wafer W. In FIG. 11, the shot areas 13 are exaggerated.

Studies have been made to suppress the dissolution of a resist film formed on a surface of a wafer W and to make the liquid layer used for immersion exposure difficult to remain on the surface of the wafer W by forming a water-repellent protective film on the surface of the wafer W before forming the resist film on the surface of the wafer W and subjecting the wafer W to immersion exposure.

A film removing method mentioned in JP-A 2005-183709 (Patent document 2) removes a water-repellent protective film formed on a surface of a wafer W by a developing system after subjecting the wafer W to a heating process by a heating device.

When the wafer W having the protective film formed on the resist film formed on the surface of the wafer W is subjected to the heating process, the resist film coated with the protective film is not exposed to a hot atmosphere in the heating device. Consequently, substances contained in the resist film and those existing on the surface of the resist film segregate and the distribution of substances in the resist film becomes nonuniform. When the resist film of a nonuniform quality is processed by a developing process, defects are produced in the resist film and the controllability of the width of lines forming a resist pattern is unsatisfactory.

SUMMARY OF THE INVENTION

The present invention has been made under such circumstances and it is therefore an object of the present invention to provide a method of forming a resist film on a substrate and processing the resist film processed by immersion exposure that exposes the resist film through a liquid film to light by a developing process, capable of reducing defects caused by development and of improving the controllability of the width of lines forming a resist pattern and to provide a storage medium storing computer-readable programs for accomplishing the method.

A coating and developing method according to the present invention includes the steps of: forming a resist film on a substrate; forming a protective film to protect the resist film during an immersion exposure process using a liquid layer by coating a surface of the substrate with a protective film forming solution containing a water-repellent material; removing the protective film from the substrate after the substrate has been processed by an immersion exposure process that exposes the resist film to light through a liquid layer formed over the resist film; heating the substrate by a heating process; and processing the resist film by a developing process.

The coating and developing method may further include the step of cleaning the surface of the substrate processed by immersion development with a cleaning liquid to be executed before the step of removing the protective film or may further include the step of cleaning the surface of the substrate with a cleaning liquid to be executed after the step of removing the protective film and before the step of heating the substrate by the heating process.

A coating and developing system according to the present invention includes: a first coating unit for coating a substrate with a liquid resist film; a second coating unit for coating a surface of the substrate with a protective film forming solution containing a water-repellent material to protect the resist film during an immersion exposure process using a liquid layer; a protective film removing unit including a substrate holding device for horizontally holding the substrate, and a chemical solution pouring nozzle for pouring a chemical solution for removing the protective film onto the surface of the substrate processed by an immersion exposure process that forms a liquid layer over the resist film and held by the substrate holding device; a heating unit for heating the substrate by a heating process after the protective film has been removed from the substrate; and a developing unit for processing the substrate by a developing process after the substrate has been processed by the heating process.

In the coating and developing system, the protective film removing unit may further include a cleaning liquid pouring nozzle for pouring a cleaning liquid onto the surface of the substrate held by the substrate holding device.

The coating and developing system may further include a controller for controlling the respective positions of the cleaning liquid pouring nozzle and the chemical solution pouring nozzle so as to remove the protective film after cleaning the surface of the substrate or may further include a controller for controlling the respective positions and pouring operations of the cleaning liquid pouring nozzle and the chemical solution pouring nozzle so as to clean the surface of the substrate after removing the protective film. The cleaning liquid pouring nozzle and the chemical solution pouring nozzle may be replaced with a single nozzle. The substrate may be processed selectively by either of a first processing mode in which the surface of the substrate is cleaned, and then the protective film is removed, and a second processing mode in which the protective film is removed, and then the surface of the substrate is cleaned. The substrate may be processed by a third processing mode in which the surface of the substrate is cleaned, the protective film is removed, and then the surface of the substrate is cleaned.

A storage medium according to the present invention stores a computer-readable program to be carried out by a coating and developing system for coating a substrate with a liquid resist film to form a resist film on a surface of the substrate, processing the substrate by a heating process after the substrate has been processed by an immersion exposure process that exposes the resist film to light through a liquid layer formed on the resist film and processing the substrate by a developing process, including the steps of: forming a resist film on a substrate; forming a protective film to protect the resist film during the immersion exposure process using a liquid layer by coating a surface of the substrate with a protective film forming solution containing a water-repellent material; removing the protective film from the substrate after the substrate has been processed by the immersion exposure process that exposes the resist film to light through a liquid layer formed on the resist film; heating the substrate by a heating process; and developing the substrate by the developing process.

The computer-readable program stored in storage medium may further include the step of cleaning the surface of the substrate processed by the immersion exposure process with a cleaning liquid to be executed before the step of removing the protective film or may further include the step of cleaning the surface of the substrate with a cleaning liquid to be executed before the step of removing the protective film and after the step of heating the substrate by the heating process.

The inventors of the present invention found that the protective film for protecting the resist film during the immersion exposure process affects the developing process adversely when the protective film is heated by the heating process before the substrate is subjected to the developing process and devised the coating and developing method that removes the protective film before the substrate is processed by the heating process on the basis of this knowledge. Thus the coating and developing method of the present invention suppresses the segregation of the components of the resist film during the heating process attributable to the protective film. Consequently, defects caused by development can be reduced and the controllability of the width of lines forming a resist pattern can be improved.

It is preferable to clean the substrate because water drops remaining on the surface of the substrate after the immersion exposure process evaporate and form water marks on the substrate. The protective film removing unit of the coating and developing system of the present invention is provided with the cleaning liquid pouring nozzle to clean the surface of the substrate. Therefore, the protective film removing unit can carry out both the protective film removing process and the cleaning process, the coating and developing system has a small footprint and processes can be simplified.

According to the present invention, the protective film removing process and the substrate cleaning process are executed in one of the first, the second and the third processing mode. A suitable one of those processing mode is selected, for example, taking the material of the protective film into consideration to process the substrate subtly.

BRIEF DESCRIPTION OF THE DRAWINGS

FIGS. 6A to 6K are views of assistance in explaining the flow of a wafer in the coating and developing system shown in FIG. 1;

FIGS. 7A to 7C are views of assistance in explaining processes to be carried out by the protective film removing unit;

DESCRIPTION OF THE PREFERRED EMBODIMENTS

Figure 1:
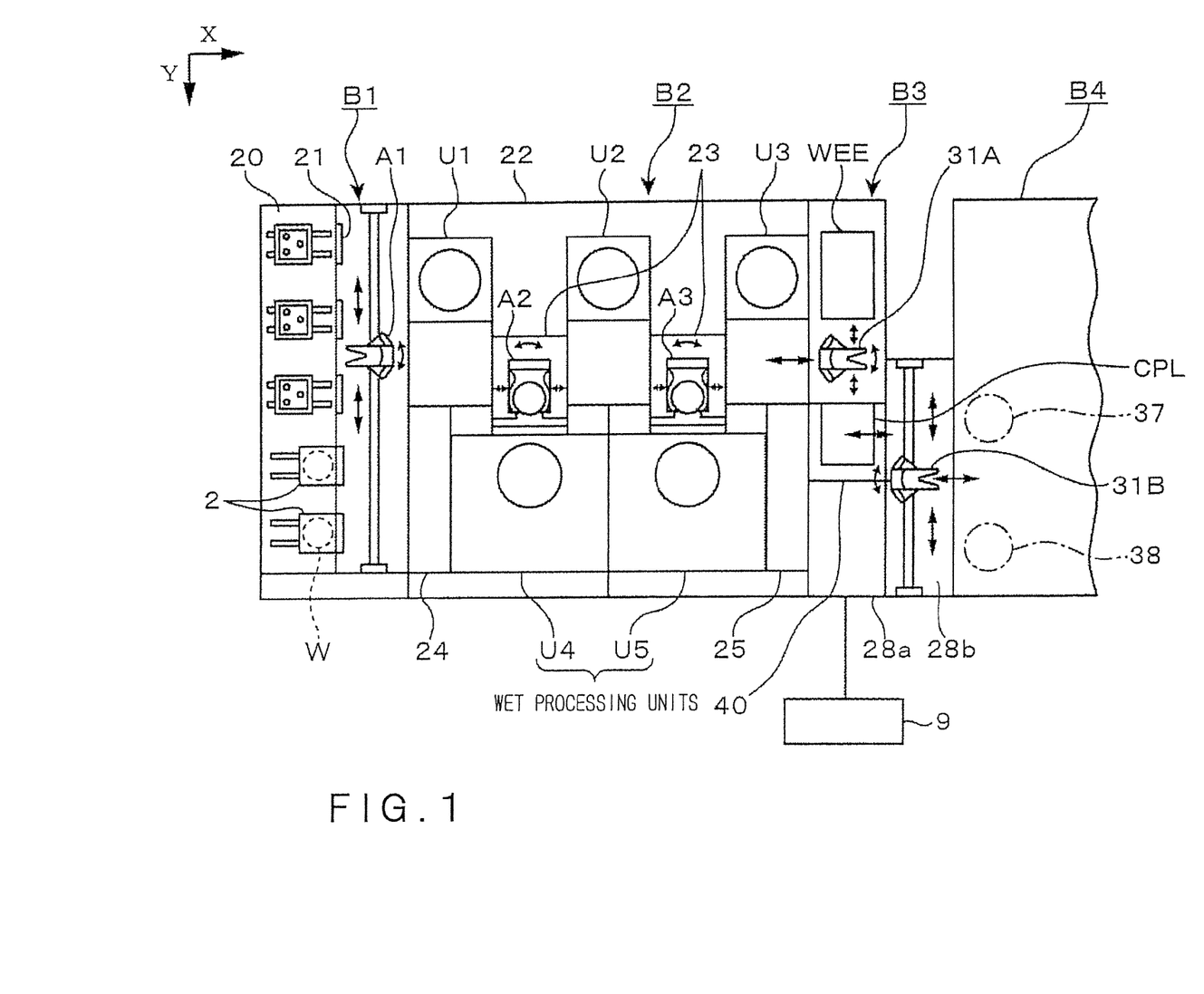
FIG. 1 is a plan view of a coating and developing system in a preferred embodiment according to the present invention.
Figure 2:
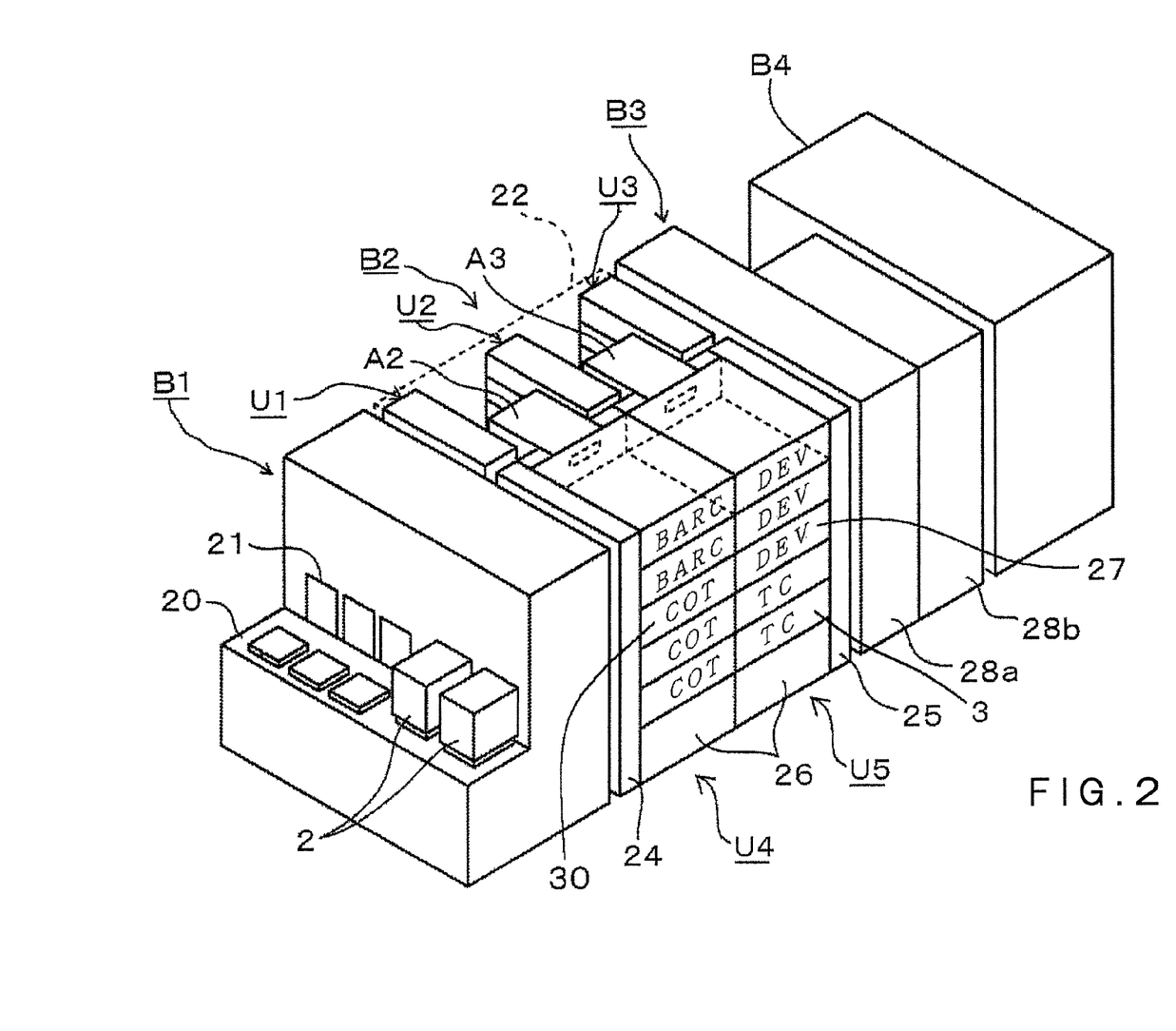
FIG. 2 is a perspective view of the coating and developing system shown in FIG. 1.

A system built by connecting an exposure system to a coating and developing system in a preferred embodiment according to the present invention will be briefly described with reference to FIGS. 1 and 2. Referring to FIGS. 1 and 2, a carrier 2 containing, for example, thirteen wafers W, namely, substrates, in an airtight fashion is delivered to a carrier station B1. The carrier station B1 is provided with a stage 20 capable of supporting a plurality of carriers 2 thereon, a wall disposed behind the stage 20 and provided with closable openings 21, and a transfer device A1 for taking out the wafers W from the carrier 2 through the closable opening 21.

A processing block B2 surrounded by a box 22 is disposed behind and joined to the carrier station B1. The processing block B2 includes shelf units U1, U2 and U3 arranged backward in that order, wet processing units U4 and U5, main carrying device A2 and A3 for transferring a wafer W between the shelf units U1 to U3 and the wet processing units U4 and U5. Each of the shelf units U1, U2 and U3 is built by stacking heating and cooling units in layers. The shelf units U1 to U3 and the main carrying devices A2 and A3 are arranged alternately. The main carrying devices A2 and A3 are disposed in a space 23 defined by the opposite side surfaces of the shelf units U1 and U2, a side surface of the wet processing unit U4 and a rear surface on the left side as viewed from the carrier station B1, and a space 23 defined by the opposite side surfaces of the shelf units U2 and U3, a side surface of the wet processing unit U5 and the rear surface, respectively. In FIGS. 1 and 2, indicated at 24 and 25 are temperature and humidity control units including temperature controllers for controlling the temperature of processing solutions to be used by the units and ducts for air conditioning.

As shown by way of example in FIG. 2, the wet processing unit U4 is built by stacking coating devices 30 (COT) for coating a wafer W with a liquid resist film, and antireflection film forming devices 3 (BARC) in layers, and the wet processing unit U5 is built by stacking protective film forming devices 3 (TC) for forming a water-repellent protective film on a wafer W by coating the surface of the wafer W with a coating liquid containing a water-repellent material, such as a fluorocarbon solvent, and developing devices 27 (DEV) for processing a wafer W by a developing process in layers.

Each of the shelf units U1, U2 and U3 is built by stacking various devices for processing a wafer W by pretreatment processes before the wafer W is processed by the wet processing units U4 and U5 and for processing a wafer W by posttreatment processes after the wafer W has been processed by the wet processing units U4 and U5 in, for example, ten layers. Each of the shelf units U1, U2 and U3 includes heating devices for baking a wafer W and cooling devices for cooling a wafer W.

A developing system or exposure system B4 is connected to the shelf unit U3 of the processing block B2 by an interface block B3. The interface block B3 will be described with reference to FIGS. 1, 2 and 3. The interface block B3 has a first carrying chamber 28a and a second carrying chamber 28b longitudinally arranged between the processing block B2 and the exposure system B4. A main carrying device 31A and an auxiliary carrying device 31B are placed in the first carrying chamber 28a and the second carrying chamber 28b, respectively. The main carrying device 31A and the auxiliary carrying device 31B are substrate carrying means. The main carrying device 31A includes a base member 32 capable of moving vertically and of turning about a vertical axis, and an arm 33 capable of moving longitudinally on the base member 32. In the first carrying chamber 28a, a edge exposure device WEE for selectively exposing a peripheral part of a wafer W and a buffer cassette SBU capable of temporarily storing, for example, twenty-five wafers W are disposed on the left side, as viewed from the carrier station B1, of the main carrying device 31A. A protective film removing unit 40 for removing a protective film formed on a wafer W, and a precision temperature control unit CPL provided with, for example, a cooling plate and placed on the protective film removing unit 40 are disposed on the right side, as viewed from the carrier station B1, of the main carrying device 31A.

Figure 3:
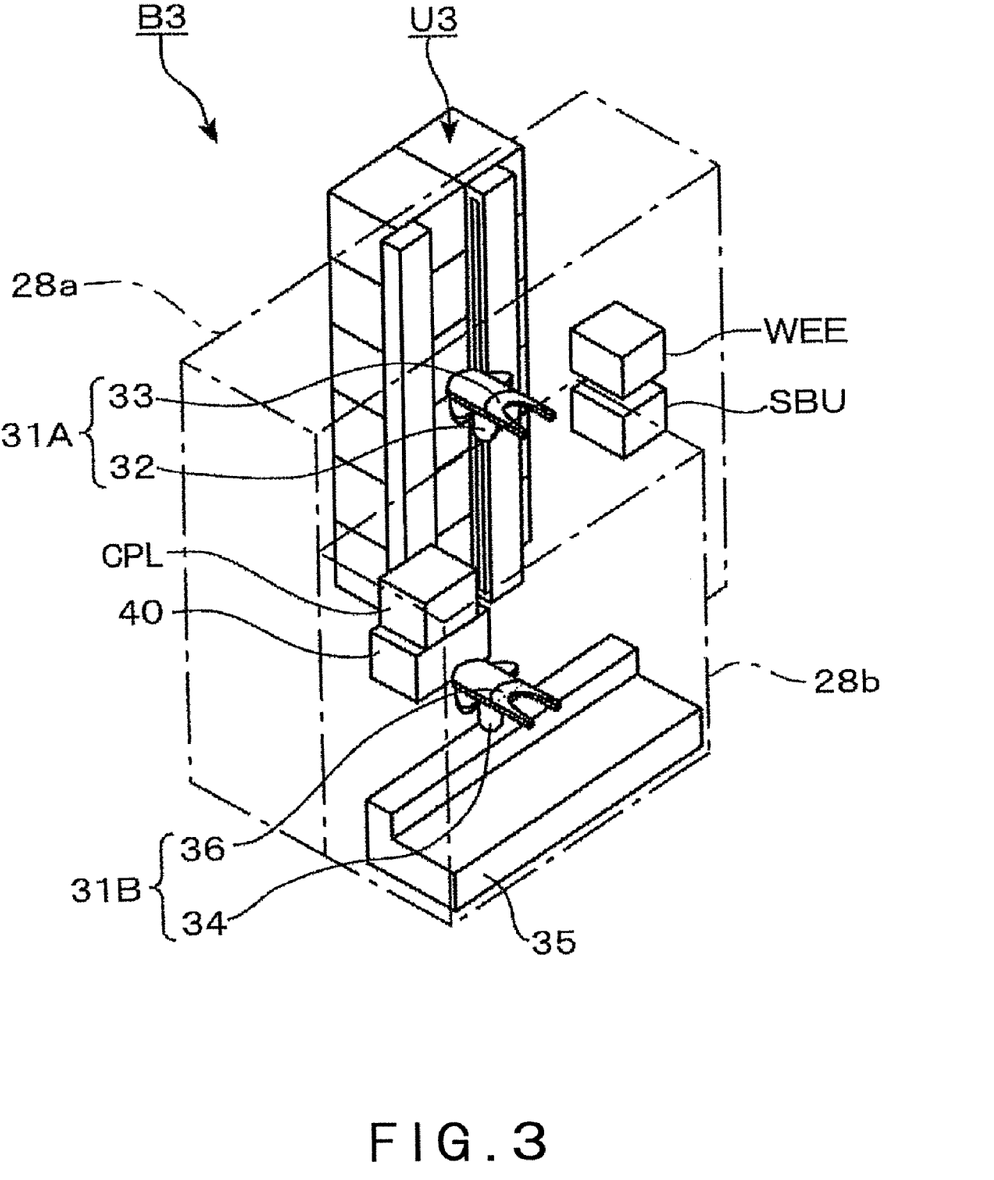
FIG. 3 is a schematic perspective view of an interface block included in the coating and developing system shown in FIG. 1.

The main carrying device 31A carries a wafer W not yet processed by an exposure process and placed in a transfer unit TRS1 included in the shelf unit U3 sequentially to the edge exposure device WEE, the buffer cassette SBU and the precision temperature control unit CPL. The main carrying device 31A carries the wafer W processed by a protective film removing process and cleaning proc to the heating unit PEB.

The auxiliary carrying device 31B includes a base member 34 capable of moving vertically and of turning about a vertical axis, a guide mechanism 35 for laterally moving the base member 34, and an arm 36 capable of moving longitudinally on the base member 34. The auxiliary carrying device 31B carries the wafer W from the precision temperature control unit CPL to a receiving stage 37 included in the exposure system B4, and carries the wafer W from a delivery stage 38 included in the exposure system B4 to the protective film removing unit 40.

Figure 4A:
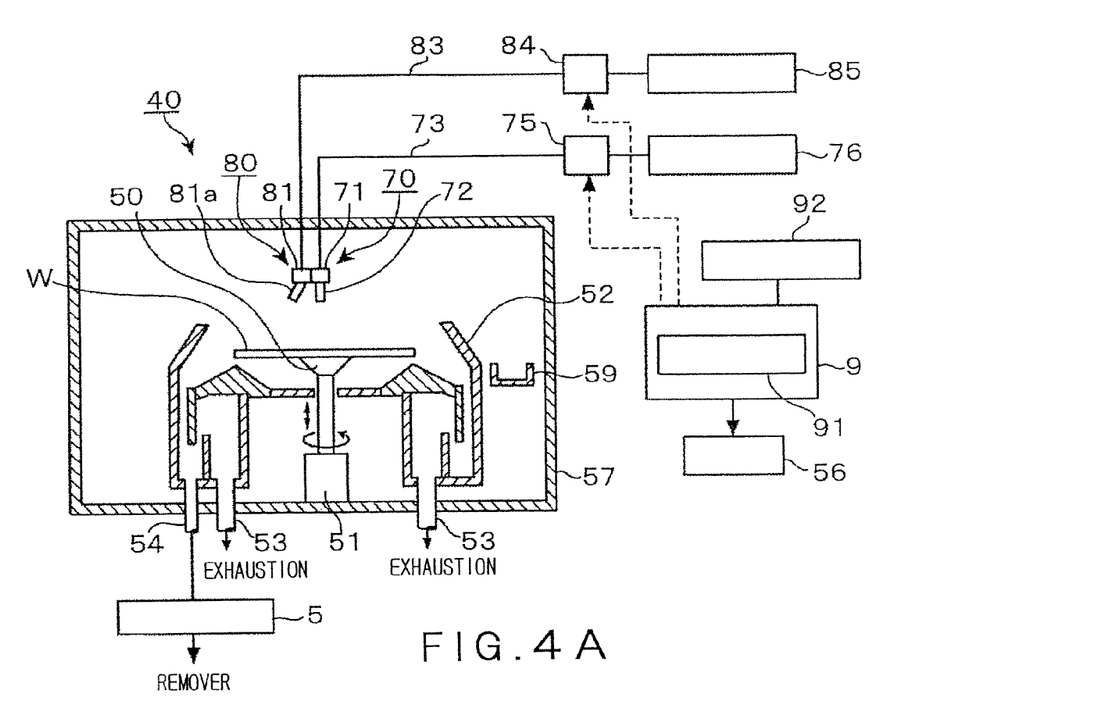
FIG. 4A is a schematic sectional view of a protective film removing unit included in the interface block.
Figure 4B:
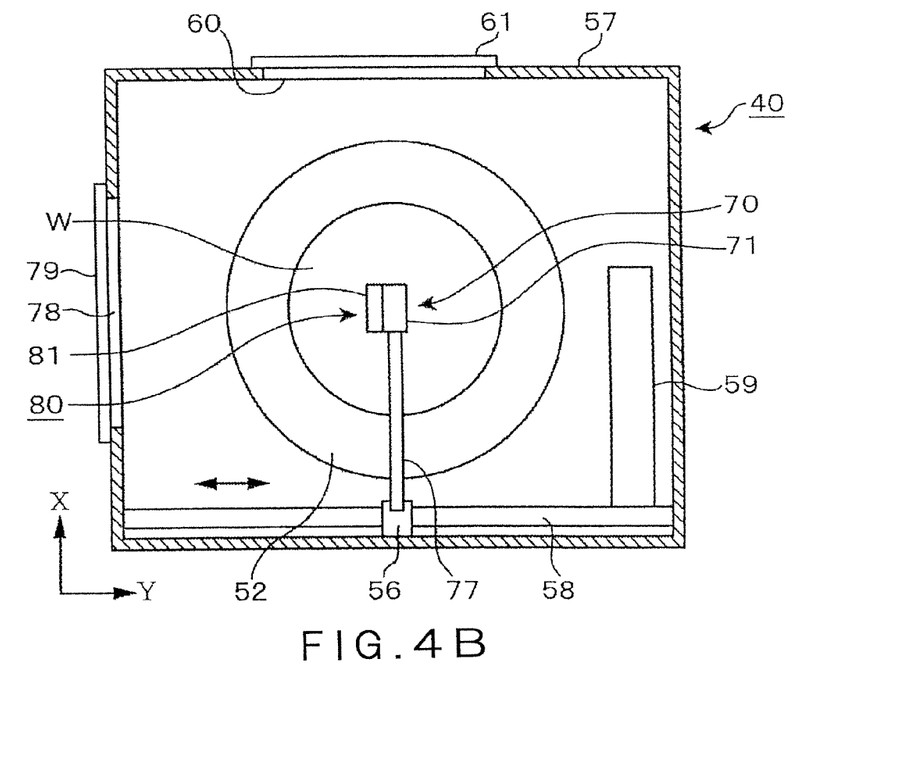
FIG. 4B is a partly sectional schematic plan view of the protective film removing unit.
Figure 5A:
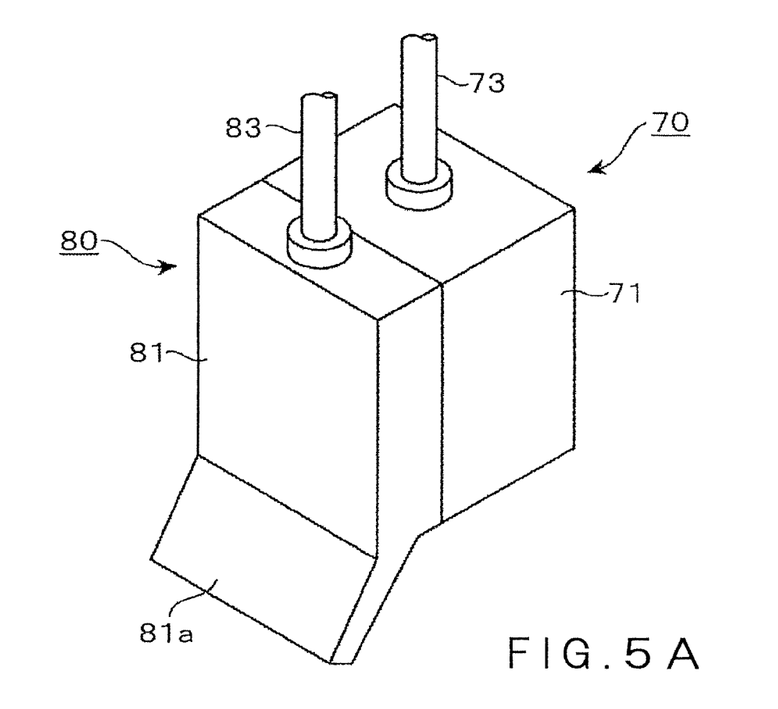
FIG. 5A is a perspective view of a chemical solution pouring nozzle and a cleaning liquid pouring nozzle included in the protective film removing unit.
Figure 5B:
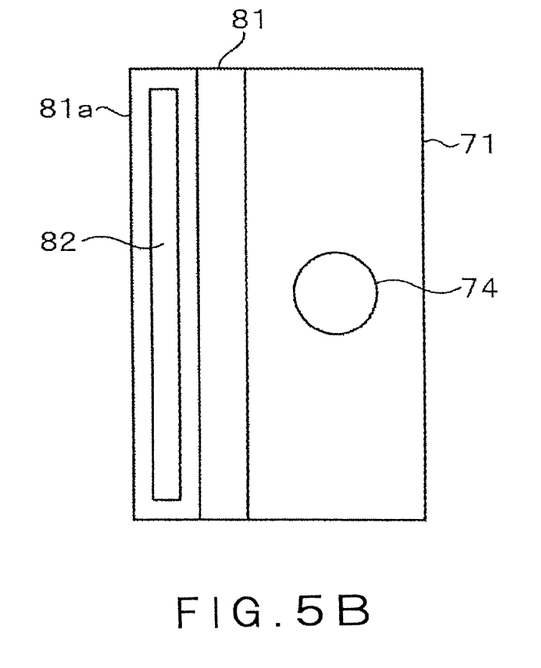
FIG. 5B is a bottom view of the chemical solution pouring nozzle and the cleaning liquid pouring nozzle.

The construction f the protective film removing unit 40 will be described with reference to FIGS. 4A and 4B. In FIGS. 4A and 4B, indicated at 50 is a spin chuck, namely, a substrate holding device, for holding a wafer W in a horizontal position by suction. The spin chuck 50 can be moved in vertical directions and can be rotated about a vertical axis by a driving device 51. The spin chuck 50 and the wafer W held on the spin chuck 50 are surrounded by a cup 52. An exhaust pipe 53, and a draining unit including a drain pipe 54 are connected to the bottom of the cup 52. A drain separating mechanism 5 is connected to the exit end of the drain pipe 54. The drain separating mechanism 5 separates a remover and a cleaning liquid contained in the drain to recover only the remover.

The protective film removing unit 40 is provided with a chemical solution pouring nozzle (hereinafter, referred to as "remover pouring nozzle") 70 for pouring a chemical solution (hereinafter, referred to as "remover") onto the wafer W. As shown in FIGS. 4A, 4B, 5A and 5B, the remover pouring nozzle 70 has a body 71 of a shape resembling a rectangular tube having a bottom wall provided with a pouring opening 72. The bottom wall of the body 71 is provided with, for example, a small, round pouring opening 74. A remover supply pipe 73 has one end connected to the top wall of the body 71 and the other end connected through a flow control system 75 including a valve and a flow regulator to a remover source 76. When a protective film formed on a surface of the wafer W is soluble in an alkaline solution, the remover is a diluted developer or a thinner. When the protective film is insoluble in an alkaline solution, the remover is a fluorocarbon solvent or the like. If a diluted developer is used as a remover, the concentration of the developer is adjusted according to the material of the protective film.

As shown in FIG. 4B, the remover pouring nozzle 70 is connected to a moving mechanism 56 by an L-shaped arm 77. The moving mechanism 56 moves the arm 77 along a guide rail 58 extended longitudinally, i.e., extended in the direction of the arrow Y, in a processing vessel. The arm 77 can be moved from a waiting area 59 outside of one end of the cup 52 toward the other end of the cup 52. The arm 77 can be also moved vertically.

As shown in FIGS. 4A, 4B, 5A and 5B, a cleaning liquid pouring nozzle 80 has a body 81 of a shape resembling a rectangular tube joined to a side wall of the body 71 of the remover pouring nozzle 70, and a nose 81a projecting obliquely downward from the body 81 and having a bottom wall provided with a discharge opening 82 having the shape of a slit. A cleaning liquid is poured obliquely downward through the discharge opening 82 onto the surface of the wafer W. A cleaning liquid supply pipe 83 has one end connected to the top wall of the body 81 and the other end connected through a flow control system 84 including a valve and a flow regulator to a cleaning liquid source 85. The cleaning liquid is, for example, pure water or a surface active agent. As shown in FIG. 4B, an opening 60 formed is in a wall of the processing vessel 57 facing a working space in which the auxiliary carrying device 31B works. The wafer W is carried into and carried out of the processing vessel 57 through the opening 60. The opening 60 is covered with a shutter 61. As shown in FIG. 4B, an opening 78 is formed in a wall of the processing vessel 57 facing a working space in which the main carrying device 31A works. The wafer W is carried into and carried out of the processing vessel 57 through the opening 78. The opening 78 is covered with a shutter 79.

As shown in FIGS. 1 and 4A, the coating and developing system is provided with a controller 9. The controller 9 is provided with a recipe storage unit 91. A plurality of process recipes (process recipes 1 to 3) are stored in the recipe storage unit 91. The process recipes specify the steps of protective film removing processes and cleaning processes to be carried out by the protective film removing unit 40 to remove the protective film formed on the surface of the wafer W and to clean the surface of the wafer W. The controller 9 is provided with a recipe choosing device 92 to be operated by the operator to choose desired one of the process recipes (the process recipes 1 to 3) displayed on a screen. The recipe choosing device 92 is, for example, a mouse, a keyboard or soft switches of a touch panel. The controller 9 executes operations according to the chosen process recipe to control the flow control systems 75 and 84 and the moving mechanism 56. Thus the controller 9 controls operations for starting and stopping supplying the remover to the remover pouring nozzle 70, for starting and stopping supplying the cleaning liquid to the cleaning liquid pouring nozzle 80, and for positioning the remover pouring nozzle 70 and the cleaning liquid pouring nozzle 80.

The controller 9 is, for example, a computer that carries out a series of operations according to a computer program. The computer program is stored in a storage medium, such as a flexible disk (FD), a memory card, a compact disk (CD) or a magnetooptical disk (MO). The computer program is installed in the computer. It is supposed in the following description that the computer program includes data, such as the process recipes, in addition to steps of processes, namely, instructions.

Figure 6A:
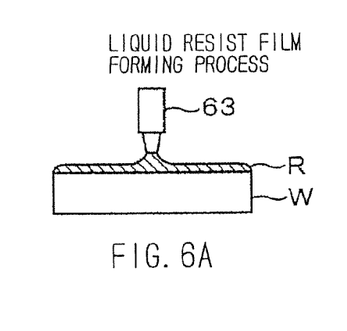
Figure 6B:
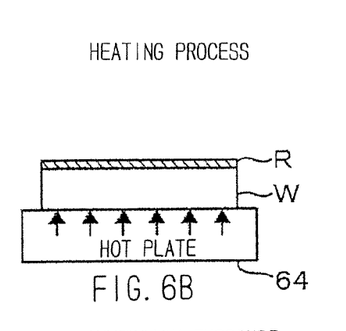
Figure 6C:
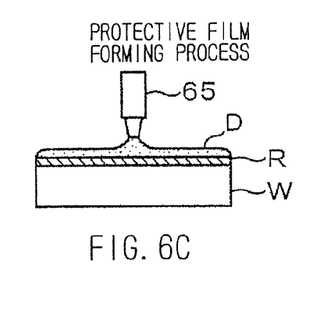

The operation of the coating and developing system will be described with reference to FIGS. 6A to 6K and 7A to 7C. A carrier 2 containing wafers W is delivered from an external device to the stage 20. The lid of the carrier 2 and the opening 21 are opened simultaneously. The transfer device A1 takes a wafer W from the carrier 2. The wafer W is transferred through a transfer unit, not shown, namely, one of the layered devices of the shelf unit U1 to the main carrying device A2. The wafer W is subjected to pretreatment processes, such as a hydrophobicity imparting process and a cooling process, before being subjected to a coating process. Then, the coating unit (COT) 30 rotates the wafer W and, at the same time, pours a liquid resist onto a central part of a surface of the wafer W to coat the surface of the wafer with a resist film R by a spin coating method as shown in FIG. 6A. Then, the wafer W is carried to the heating unit (PAB), namely, one of the devices of the shelf units U1 to U3. The wafer W is processed by a heating process (baking process) by radiation heat emitted by a hot plate 64 as shown in FIG. 6B. Subsequently, the wafer W is carried to the protective film forming unit (TC) 3, namely, one of the devices of the wet processing unit U5. Then, as shown in FIG. 6C, the wafer W is rotated and a coating liquid D, namely, a fluorine-contained solution, is poured through a coating liquid pouring nozzle 65 onto a central part of the surface of the wafer W to form a water-repellent protective film on the surface of the wafer W. In some case, the wafer W is not subjected to the hydrophobicity imparting process and an antireflection film is formed on the surface of the wafer W by the antireflection film forming unit (BARC). In some other case, an antireflection film is formed on the resist film and the protective film is formed on the antireflection film.

Figure 6D:
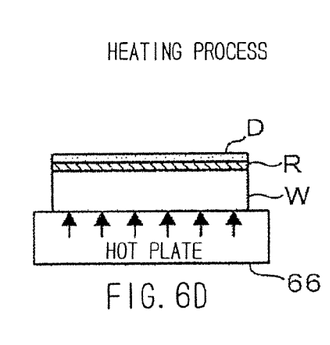
Figure 6E:
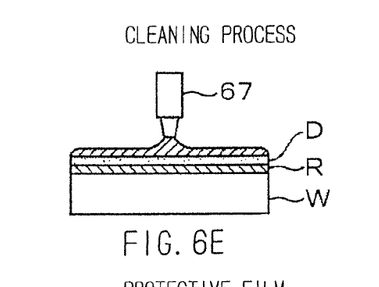
Figure 6F:
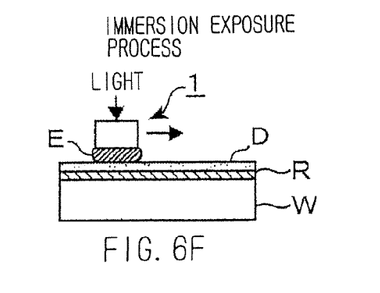
Figure 6G:
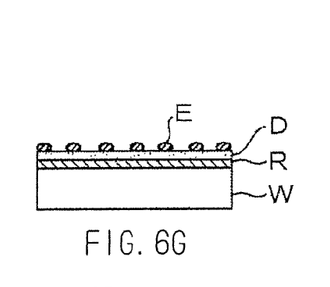

Then, the wafer W is carried to the heating unit (PAB), namely, one of the devices of the shelf units U1 to U3. The wafer W is processed by a heating process (baking process) by radiation heat emitted by a hot plate 66 as shown in FIG. 6D, the wafer W is cooled, and then the cooled wafer is carried to the cleaning unit, not shown. The cooling unit rotates the wafer W and pours a cleaning liquid onto a central part of the surface of the wafer W through a nozzle 67 as shown in FIG. 6E to clean the surface of the protective film D. Then, the wafer W is transferred through a transfer unit TRS1 included in the shelf unit U3 to the interface block B3. The main carrying device 31A of the interface block B3 carries the wafer W sequentially to the edge exposure device WEE, the buffer cassette (SBU) and the precision temperature adjusting unit (CPL). Then, the auxiliary carrying device 31B carries the wafer W from the precision temperature adjusting unit (CPL) to the receiving stage 37 shown in FIG. 1. Then, the wafer W is taken into the exposure system B4. The exposure system B4 processes the wafer W by the exposure device 1 described in the description of the related art in connection with FIGS. 10 and 11. The exposure device 1 carries out an immersion exposure process as shown in FIG. 6F. The immersion exposure process forms a liquid film E on the surface of the wafer W and exposes the wafer W to light through the liquid film E to form a desired circuit pattern in the resist film R by one exposure cycle. This exposure cycle is repeated to form circuit patterns successively in the resist film R. In some cases, small water drops E remains on the surface of the wafer W as shown in FIG. 6G after the completion of the immersion exposure process. If the water drops E are left on the surface of the wafer W for a long time, the water drops E permeate the protective film D and reach the surface of the resist film R. The water drops E forms layers insoluble in the developer, namely, the so-called watermarks. It is possible that the watermarks affect adversely to the uniformity of the width of lines forming the circuit pattern. Therefore, the water drops E are removed by the protective film removing unit 40. The wafer W processed by the immersion exposure process is carried to the delivery stage 38. Then, the auxiliary carrying device 31B carries the wafer W to the protective film removing unit 40.

Figure 6H:
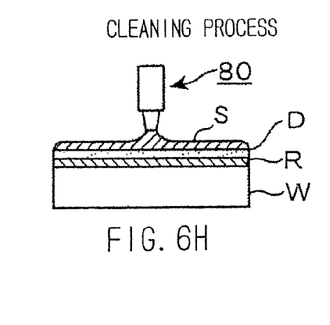
Figure 6I:
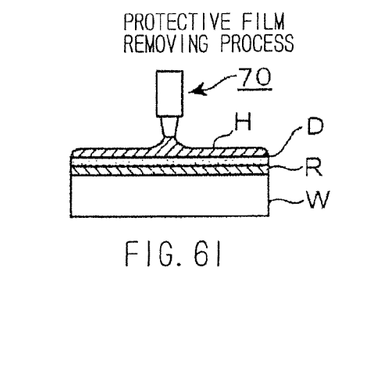

The protective film removing unit 40 rotates the wafer W and, at the same time, pours a cleaning liquid S, such as pure water, through the cleaning liquid pouring nozzle 80 onto a central part of the surface of the wafer W as shown in FIG. 6H to remove water drops E remaining on the surface of the wafer W by a cleaning process. Then, as shown in FIG. 6I, the wafer W is rotated and, at the same time, remover H, such as a fluorocarbon solvent, is poured through the remover pouring nozzle 70 onto a central part of the surface of the wafer W to remove the protective film D from the surface of the wafer W by a removing process. A series of those processes is specified by one of the process recipes (the recipes 1 to 3) stored in the recipe storage unit 91.

Figure 7A:
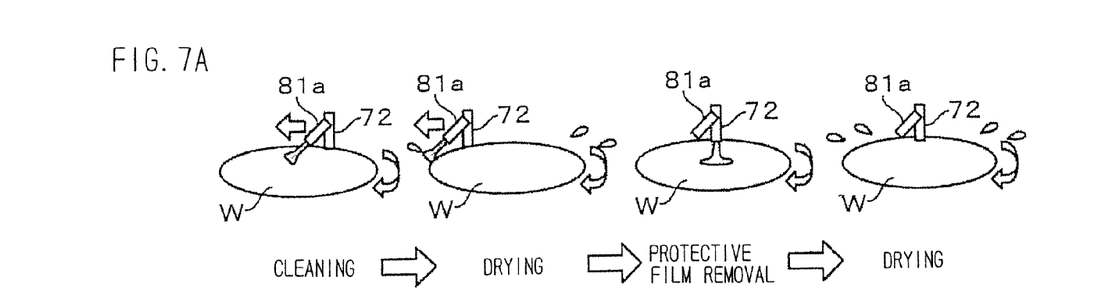
Figure 7B:
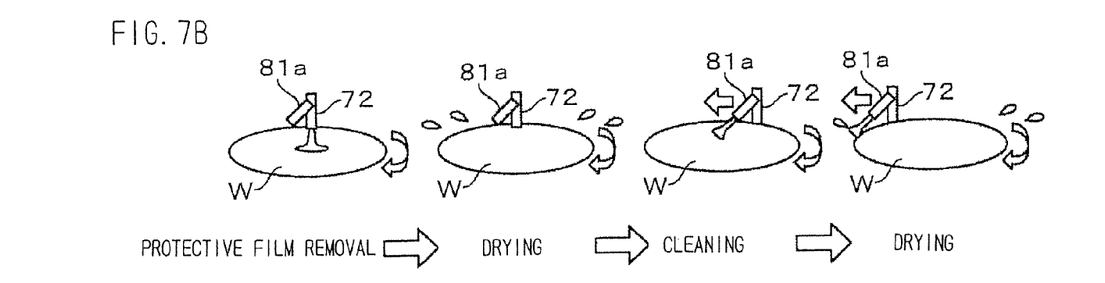

A series of processes specified by the process recipe 1 will be described with reference to FIG. 7A. Referring to FIG. 7A, the wafer W is mounted and held by suction on the spin chuck 50 through cooperative operations of the auxiliary carrying device 31B and the spin chuck 50. Subsequently, the cleaning liquid S is poured through the cleaning liquid pouring nozzle 80 onto a central part of the surface of the wafer W while the wafer W is rotated at a low rotating speed. The cleaning liquid poured onto the central part of the surface of the wafer W spreads toward the circumference of the wafer W. After the cleaning liquid has spread over the entire surface of the wafer W, the moving mechanism 56 moves the cleaning liquid pouring nozzle 80 from a position above the center of the wafer W toward a position above the circumference of the wafer W so that the surface of the wafer W wetted with the cleaning liquid S dries gradually from the central part toward the circumference of the wafer W. The water drops E remaining on the wafer W is washed off by the cleaning liquid S. A gas jetting nozzle, not shown, may be held behind the cleaning liquid pouring nozzle 80 with respect to the rotating direction of the wafer W and moved together with the cleaning liquid pouring nozzle 80 to blow a gas, such as air or nitrogen gas, against the surface of the wafer W. The gas jetted through the gas jetting nozzle enhances the water drop removing effect of the cleaning liquid poured through the cleaning liquid pouring nozzle 80. Thus it is preferable to assist the cleaning effect of the cleaning liquid poured through the cleaning liquid pouring nozzle 80 by the gas jetted through the gas jetting nozzle. Then, the remover H is poured through the remover pouring nozzle 70 onto a central part of the surface of the wafer W while the wafer W is rotated at a low rotating speed. The remover H poured through the remover pouring nozzle 70 onto the central part of the surface of the wafer W spreads toward the circumference of the wafer W. The remover H removes the protective film D from the surface of the wafer W. Then, the wafer W is rotated at a high rotating speed to dry the surface of the wafer W by spin drying.

When the process recipe 2 is chosen, the series of processes specified by the process recipe 1 is reversed. When the process recipe 2 is chosen, the remover H is poured onto the surface of the wafer W first to remove the protective film D form the wafer W, and then the cleaning liquid S is poured onto the surface of the wafer W to clean the surface of the wafer W by a cleaning process.

Figure 7C:
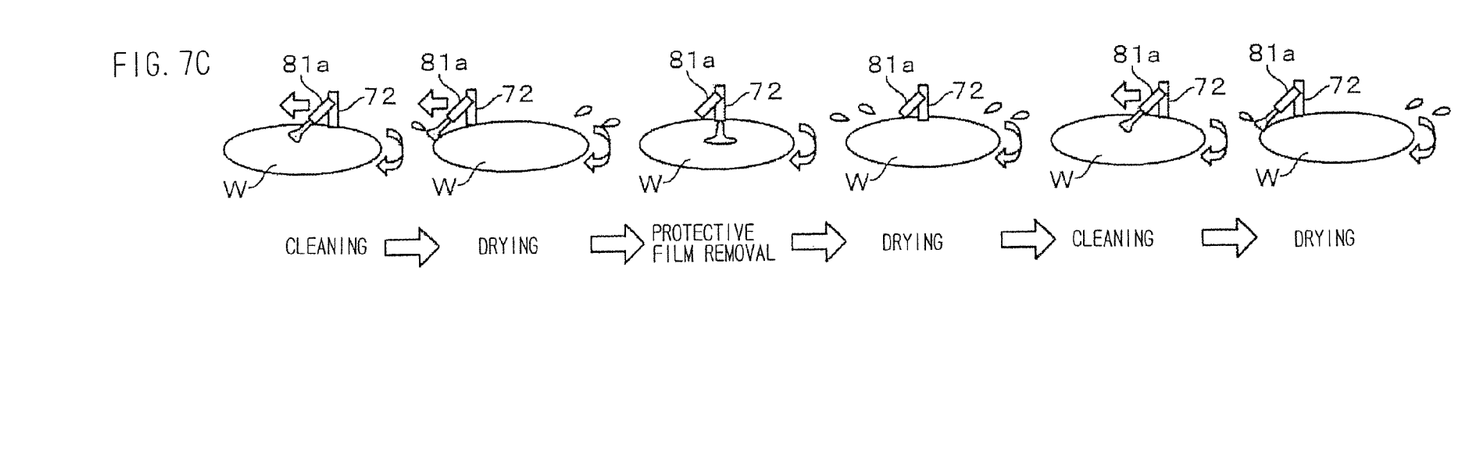

When the process recipe 3 is chosen, the cleaning liquid S is poured onto the surface of the wafer W first to clean the surface of the wafer W by a cleaning process. Subsequently, the remover H is poured onto the surface of the wafer W to remove the protective film D formed on the surface of the wafer W, and then the cleaning liquid S is poured onto the surface of the wafer W to clean the surface of the wafer W again by a cleaning process. Thus, as shown in FIG. 7C, the process recipe 3 specifies a sequential series of a cleaning process, a protective film removing process and a cleaning process. The cleaning process and the protective film removing process are the same as those specified by the process recipe 1 shown in FIG. 7A.

Figure 6J:
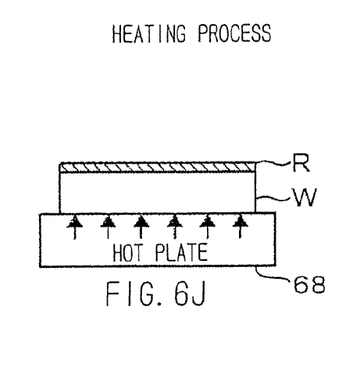
Figure 6K:
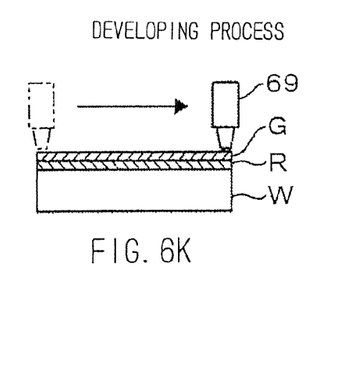

After the protective film D has been removed from the surface of the wafer W and the surface of the wafer W has been cleaned by the protective film removing process and the cleaning process carried out by the protective film removing unit 40, the wafer W is carried to the heating unit (PEB) of the shelf unit U3 by the main carrying device 31A. Then, as shown in FIG. 6J, the wafer W is processed by a heating process (baking process) using radiation heat emitted by a hot plate 68. Then, the wafer W is carried to the developing unit (DEV) of the shelf unit U5. A developer pouring nozzle 69 is moved from a position above one diametrical end to a position above the other diametrical end of the wafer W to coat the surface of the wafer W with a developer G as shown in FIG. 6K. Thus the resist film R formed on the surface of the wafer W is developed to complete a resist mask of a predetermined pattern. Then, the transfer device A1 returns the wafer W to the carrier 2 placed on the stage 20.

The coating and developing system in the preferred embodiment processes the wafer W by the protective film removing process to remove the protective film D formed on the surface of the wafer W after the wafer W has been processed by the immersion exposure process and before the wafer is subjected to the heating process. Therefore, resist film R formed on the wafer W is not coated with the protective film D when the wafer is processed by the heating process by the heating unit (PEB). Consequently, the segregation of substances contained in the resist film R and those distributed in the surface of the resist film R can be suppressed, and hence the development of defects during the developing process specific to a resist film processed by an immersion exposure process, such as circular marks in the surface of the wafer W, can be suppressed.

The protective film removing unit 40 of the coating and developing system has a cleaning function of cleaning the surface of the wafer in addition to a protective film removing function of removing the protective film D formed on the surface of the wafer W as mentioned above in connection with FIGS. 4 and 5. Thus the protective film removing unit 40 can carry out both the protective film removing process and the cleaning process when the wafer W needs to be cleaned by the cleaning process after being processed by the immersion exposure process. Therefore, the coating and developing system has a small footprint and processes can be simplified.

Although the coating and developing system does not need to carry out the cleaning process after the immersion exposure process, it is preferable to carry out the cleaning process after the immersion exposure process because it is possible that water drops E remains on the surface of the wafer W processed by the immersion exposure process and the water drops E need to be removed.

One of the process recipes (process recipes 1 to 3) is chosen according to the material of the protective film or conditions for the exposure process to be carried out by the exposure system B4, and the coating and developing system accomplishes the protective film removing process for removing the protective film D formed on the surface of the wafer W and the cleaning process for cleaning the surface of the wafer W on the basis of the chosen process recipe. Consequently, the wafer W can be subtly processed.

The cleaning process may be carried out twice or more times before or after the protective film removing process for removing the protective film D.

Figure 8:
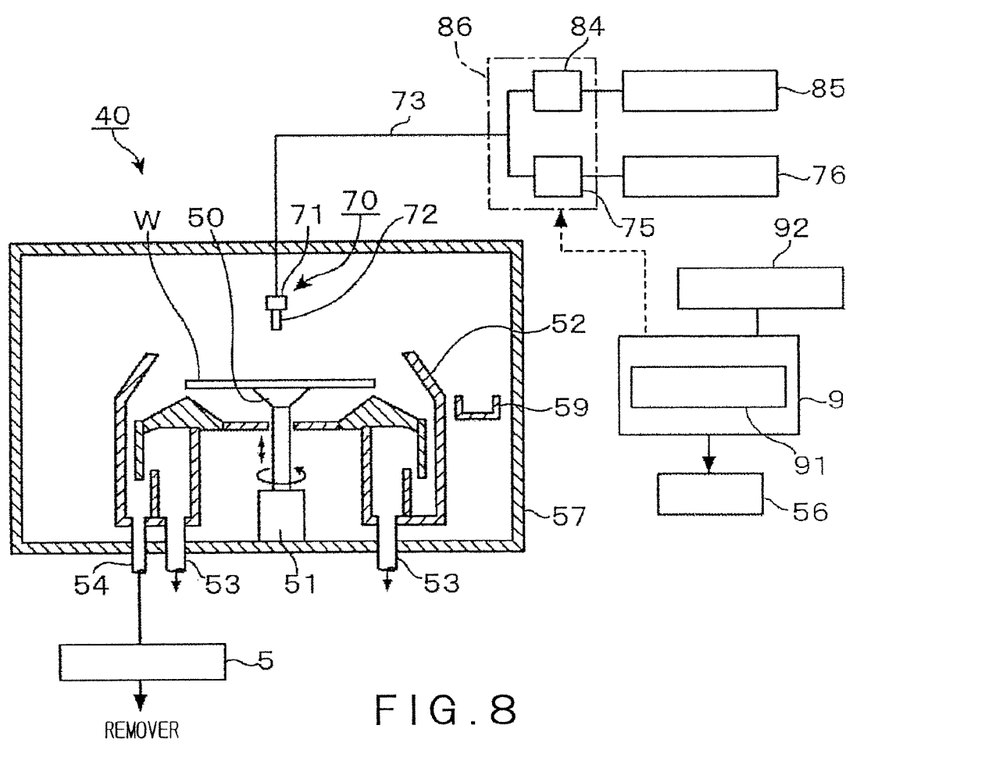
FIG. 8 is a schematic sectional view of the protective film removing unit included in the interface block.

In the protective film removing unit 40 described above, the remover pouring nozzle 70 and the cleaning liquid pouring nozzle 80 are joined together to move both the remover pouring nozzle 70 and the cleaning liquid pouring nozzle 80 by the moving mechanism 56. The remover pouring nozzle 70 and the cleaning liquid pouring nozzle 80 may be moved individually. As shown in FIG. 8, a selector 86 may be placed in a supply line connected to the remover pouring nozzle 70 to supply either of the remover or the cleaning liquid selectively to the remover pouring nozzle 70 to pour the remover or the cleaning liquid selectively through the remover pouring nozzle 70, and the cleaning liquid pouring nozzle 80 may be omitted.

Although only the single protective film removing unit 40 is installed in the first carrying chamber 28a of the interface block B3 of the coating and developing system described above, a plurality of protective film removing units 40 may be stacked in layers in the first carrying chamber 28a.

The protective film removing unit 40 may be installed in the processing block B2 instead of being installed in the interface block B3. For example, the protective film removing unit 40 may be included in the shelf unit U3 provided with the heating unit (PEB).

If a chemically amplified resist is used, it is preferable that a time between the completion of the exposure process and the start of the heating process, namely, a PED time between a time point when the exposure system provides a signal indicating the completion of preparation for delivering the wafer and a time point when the heating unit starts the heating process, is the same for all the wafers W to make the degree of diffusion of an acid produced during the exposure process uniform for all the wafers W. When the heating unit is provided with both a hot plate, and a cooling plate serving also as a wafer carrying arm, the PEB time is fixed for all the wafers by adjusting a waiting time for which the wafer is kept on the cooling plate. However, the number of the heating units increases and the cost increases if the cooling plate is used for the adjustment of the PED time.

Therefore, it is preferable to control the main carrying device 31A by the controller 9 so as to carry the wafer processed by the series of processes by the protective film removing unit 40 from the protective film removing unit 40 to the heating unit (PEB) at a fixed time after the completion of the series of processes. Thus it is preferable that the controller 9 carries out a control operation such that a time between a time point when the wafer W processed by the exposure process is delivered to the delivery stage 38 and the exposure system B4 provides an out ready signal indicating that preparation for sending out the wafer W has been completed and a time point when the wafer W is carried out from the protective film removing unit 40 is adjusted to a predetermined time. When the controller 9 carries out such a control operation, the main carrying device 31A carries out the wafer W from the protective film removing unit 40 after the passage of the predetermined time. When the PEB time is thus managed, a carrying program specifying the carrying operation of the main carrying device 31A is simple and the increase of the number of heating units (PEB) can be avoided.

Experiments

The following experiments were conducted to prove the effect of the present invention.

EXAMPLE

The process recipe 1 shown in FIG. 6A was carried out by the coating and developing system shown in FIGS. 1 to 5B. The surface of a test wafer W was cleaned and a protective film D formed on the test wafer W was removed by the protective film removing unit 40 after the exposure process and before the heating process. Then, the test wafer W was processed by a developing process by the developing unit (DEV).

COMPARATIVE EXAMPLE

A test wafer W was subjected to the protective film removing process to remove a protective film D formed on a surface of the test wafer W by the protective film removing unit 40 after the test wafer W was processed by a heating process by the heating unit (PEB). Then, the test wafer W was processed by a developing process by the developing unit (DEV). Other processes are the same as those of the example of the present invention.

Figure 9:
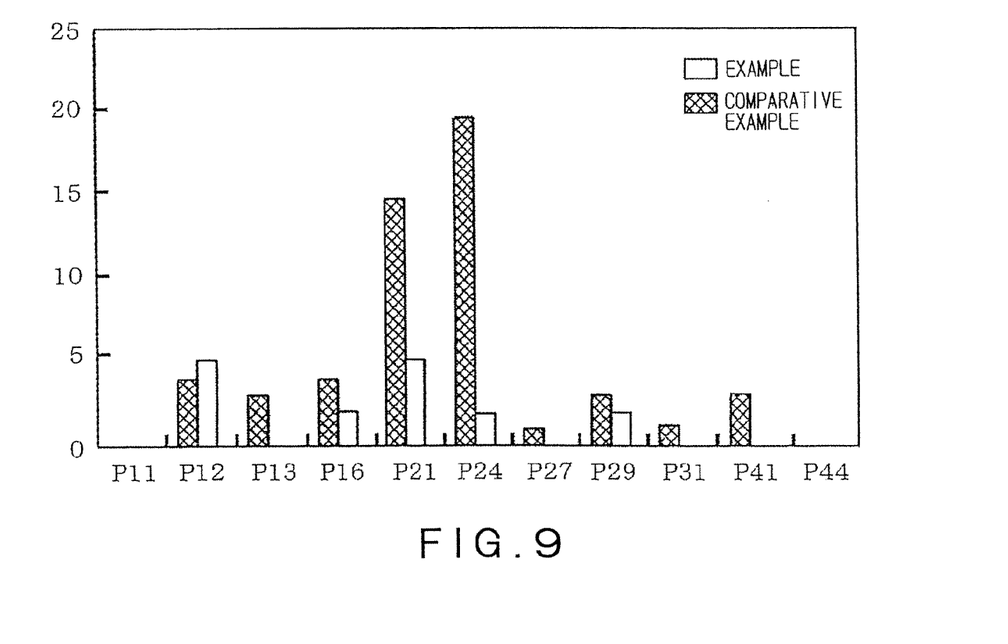
FIG. 9 is a graph of assistance in explaining results of experiments conducted to prove the effect of the present invention.

Defects existing on the surfaces of the wafers W were counted by a development defect inspecting apparatus. The counted numbers of defects are shown in FIG. 9. In FIG. 9, indicated at P11, P12 and such are defect categories. Defect categories P21 and P24 include circular marks formed on the surface of the wafers W, namely, pattern defects. Those pattern defects are caused by water drops remaining on the surface of the wafer W after the wafer W has been processed by an immersion exposure process.

As obvious from FIG. 9, the number of pattern defects of the defect categories P21 and P21 developed in the wafers W processed by the processes in the example is far less than those developed in the wafers W processed by the processes in the comparative example. It was inferred that that the wafers W processed by the processes in the example had small numbers of pattern defects because the resist film R could be satisfactorily heated by the heating unit (PEB) as the protective film D formed on the resist film R was removed before the wafer was heated by the heating unit (PEB), the resist film R was homogenized and the homogenized resist film R was processed by the developing process. It is understood from the results of the experiments that the removal of the protective film D by the protective film removing unit 40 before heating the wafer by the heating unit (PEB) is effective. As shown in FIG. 9, the number of defects of the defect category P12 in the wafers processed by the processes in the example is greater than that of the same defects in the wafers processed by the processes in the comparative example. However, the number of those defects is only five which is an insignificant value in evaluating the quality of the wafer W.

What is claimed is:

1. A coating and developing method comprising the steps of:
    forming a resist film on a substrate;
    forming a protective film to protect the resist film during an immersion exposure process using a liquid layer by coating a surface of the substrate with a protective film forming solution containing a water-repellent material;
    removing the protective film from the substrate after the substrate has been processed by an immersion exposure process that exposes the resist film to light through a liquid layer formed over the resist film;
    heating the substrate by a heating process after removing the protective film from the substrate; and
    processing the resist film by a developing process after heating the substrate by the heating process.

2. The coating and developing method according to claim 1 further comprising the step of cleaning the surface of the substrate processed by immersion development with a cleaning liquid to be executed before the step of removing the protective film.

3. The coating and developing method according to claim 2 further comprising the step of cleaning the surface of the substrate with a cleaning liquid to be executed between the step of removing the protective film and the step of processing the substrate by the heating process.

4. The coating and developing method according to claim 1 further comprising the step of cleaning the surface of the substrate with a cleaning liquid to be executed between the step of removing the protective film and the step of processing the substrate by the heating process.

5. A coating and developing system comprising:
    a first coating unit for coating a substrate with a liquid resist film;
    a second coating unit for coating a surface of the substrate with a protective film forming solution containing a water-repellent material to form a protective film and to protect the resist film during an immersion exposure process using a liquid layer;
    a protective film removing unit including a substrate holding device for horizontally holding the substrate, and a chemical solution pouring nozzle for pouring a chemical solution for removing the protective film onto the surface of the substrate processed by an immersion exposure process that forms a liquid layer over the resist film and held by the substrate holding device;
    a heating unit for heating the substrate, on which the protective film has been removed, by a heating process after the protective film has been removed from the substrate; and
    a developing unit for processing the substrate by a developing process after the substrate has been processed by the heating process.

6. The coating and developing system according to claim 5, wherein the protective film removing unit further includes a cleaning liquid pouring nozzle for pouring a cleaning liquid onto the surface of the substrate held by the substrate holding device.

7. The coating and developing system according to claim 6 further comprising a controller for controlling the respective positions of the cleaning liquid pouring nozzle and the chemical solution pouring nozzle and pouring operations of the cleaning liquid pouring nozzle and the chemical solution pouring nozzle so as to remove the protective film after cleaning the surface of the substrate.

8. The coating and developing system according to claim 7, wherein the cleaning liquid pouring nozzle and the chemical solution pouring nozzle are a single nozzle.

9. The coating and developing system according to claim 6 further comprising a controller for controlling the respective positions of the cleaning liquid pouring nozzle and the chemical solution pouring nozzle so as to clean the surface of the substrate after the protective film has been removed.

10. The coating and developing system according to claim 6, wherein the cleaning liquid pouring nozzle and the chemical solution pouring nozzle are a single nozzle.

11. The coating and developing system according to claim 6 further comprising a controller that selectively executes either of a first processing mode in which the surface of the substrate is cleaned, and then the protective film is removed, and a second processing mode in which the protective film is removed, and then the surface of the substrate is cleaned.

12. The coating and developing system according to claim 6, wherein the controller selectively executes one of a first processing mode in which the surface of the substrate is cleaned, and then the protective film is removed, a second processing mode in which the protective film is removed, and then the surface of the substrate is cleaned, and a third processing mode in which the surface of the substrate is cleaned, the protective film is removed, and then the surface of the substrate is cleaned.

13. The coating and developing system according to claim 7, wherein the cleaning liquid pouring nozzle and the chemical solution pouring nozzle are a single nozzle.

14. A storage medium storing computer-readable programs to be carried out by a coating and developing system for coating a substrate with a liquid resist film to form a resist film on a surface of the substrate, processing the substrate by a heating process after the substrate has been processed by an immersion exposure process that exposes the resist film to light through a liquid layer formed on the resist film and processing the substrate by a developing process, wherein the computer-readable programs include the steps of the coating and developing method according to claim 1.

15. The coating and developing system according to claim 6, further comprising a controller that executes a processing mode in which the surface of the substrate is cleaned, and then the protective film is removed.

16. The coating and developing system according to claim 6, further comprising a controller that executes a processing mode in which the protective film is removed, and then the surface of the substrate is cleaned.

17. The coating and developing system according to claim 6, further comprising a controller that executes a processing mode in which the surface of the substrate is cleaned, the protective film is removed, and then the surface of the substrate is cleaned.

* * * * *